(12) United States Patent
Watanabe et al.

(10) Patent No.: US 7,566,663 B2
(45) Date of Patent: Jul. 28, 2009

(54) METHOD FOR MANUFACTURING SEMICONDUCTOR DEVICE OR SEMICONDUCTOR WAFER USING A CHUCKING UNIT

(75) Inventors: Kaori Watanabe, Kanagawa (JP); Hiroyuki Itoh, Ishikawa (JP); Takatoshi Hattori, Ishikawa (JP)

(73) Assignee: NEC Electronics Corporation, Kanagawa (JP)

( * ) Notice: Subject to any disclaimer, the term of this patent is extended or adjusted under 35 U.S.C. 154(b) by 257 days.

(21) Appl. No.: 11/641,913

(22) Filed: Dec. 20, 2006

(65) Prior Publication Data

US 2007/0139857 A1      Jun. 21, 2007

(30) Foreign Application Priority Data

Dec. 21, 2005   (JP) .............................. 2005-368592

(51) Int. Cl.
    *H01L 21/302*   (2006.01)
(52) U.S. Cl. ........................................ 438/692; 216/89
(58) Field of Classification Search ................ 438/690, 438/691, 692, 693; 216/89
    See application file for complete search history.

(56) References Cited

U.S. PATENT DOCUMENTS 6,358,128 B1 *   3/2002   Sakurai et al. ................ 451/67
2004/0025911 A1 *   2/2004   Yeo et al. ..................... 134/113
2004/0137823 A1 *   7/2004   Sakurai et al. ................ 451/5
2007/0051393 A1 *   3/2007   Cho et al. .................... 134/149

FOREIGN PATENT DOCUMENTS

| JP | 10-044005 | 2/1998 |
| JP | 2005-074574 | 3/2005 |

* cited by examiner

Primary Examiner—Kin-Chan Chen
(74) Attorney, Agent, or Firm—Young & Thompson

(57) ABSTRACT

A method for manufacturing a semiconductor device or a semiconductor wafer using a chucking unit is provided to remove a slurry that adheres to the back surface of the semiconductor wafer. An edge portion of a semiconductor wafer is polished while a back surface of the semiconductor wafer is chucked to a chucking unit of a first polishing unit. The polished semiconductor wafer is then dechucked from the chucking unit of the first polishing unit. Next, a gap is formed above the chucking unit of the second polishing unit, and the semiconductor wafer is disposed therein. Water is discharged from the chucking unit of the second polishing unit to clean the back surface of the semiconductor wafer W. Thereafter, the back surface of the semiconductor wafer is chucked to the chucking unit of the second polishing unit, and the semiconductor wafer is polished.

8 Claims, 10 Drawing Sheets ic # METHOD FOR MANUFACTURING SEMICONDUCTOR DEVICE OR SEMICONDUCTOR WAFER USING A CHUCKING UNIT

This application is based on Japanese patent application No. 2005-368592, the content of which is incorporated hereinto by reference.

BACKGROUND

1. Technical Field

The present invention relates to a method for manufacturing a semiconductor device or a semiconductor wafer.

2. Related Art

Conventionally, in manufacturing process of semiconductor device or semiconductor wafer, surface or edge portion of the wafer is polished to improve the shape, cleanliness and so on. One surface of a semiconductor wafer is chucked to a chucking unit while a polishing process is carried out. The chucked surface is expressed as "back surface" hereafter. Here, slurry employed for the polishing process penetrates into the back surface of the semiconductor wafer. When a back surface is dechucked from a first chucking unit, the wafer is transferred to a second chucking unit, and then is chucked to a second chucking unit for subsequent polishing processing without cleaning process, the slurry adherently remained on the back surface of the semiconductor wafer is firmly stuck on the back surface of the semiconductor wafer. To solve the problem, for example, the semiconductor wafer just after a bevel-polishing of the edge is immersed into a water bath in keeping the wafer chucking to the chucking unit, and the chucking unit is rotated. A method for removing slurry adherently remained on a semiconductor wafer or a chucking unit is proposed by such procedure (see, for example, Japanese Patent No. 3649531). Besides, for example, another method is also proposed, which includes dechucking a polished semiconductor wafer from a chucking unit, immersing the wafer into a water bath, and shower cleaning and scrub cleaning the back surface of the semiconductor wafer (see, for example, Japanese Patent Laid-Open No. 2005-74574).

SUMMARY OF THE INVENTION

However, there is a room for improvement in view of the following points in the technologies described in the above-described Japanese Patent No. 3649531 and Japanese Patent Laid-Open No. 2005-74574. In both of the processes described in the above-described Japanese Registered Patent No. 3649531 and Japanese Patent Laid-Open No. 2005-74574, a water bath is used for removing the slurry that is adherently remained onto the back surface of the wafer, leading to an increased dimension of the manufacturing apparatus. Besides, since the semiconductor wafer is immersed into water bath while being chucked to the chucking unit in the process described in Japanese Patent No. 3649531, slurry entered between the chucking unit and the semiconductor wafers cannot be removed.

According to the present invention, there is provided a method for manufacturing a semiconductor device or a semiconductor wafer, comprising: machining a semiconductor wafer while a back surface of said semiconductor wafer is chucked to a chucking unit of a first machining member; dechucking said semiconductor wafer from said chucking unit of said first machining member; cleaning the back surface of said semiconductor wafer with a liquid; and polishing said semiconductor wafer while chucking a back surface of said semiconductor wafer to a chucking unit of a second machining member, wherein said cleaning the back surface of said semiconductor wafer includes at least one of a first cleaning operation and a second cleaning operation, wherein said first cleaning operation includes: dechucking said semiconductor wafer from the chucking unit of said first machining member; forming a predetermined gap between the chucking unit of said first machining member and said wafer; and cleaning the back surface of said semiconductor wafer by discharging a liquid from said chucking unit of said first machining member; and wherein said second cleaning operation includes: dechucking said semiconductor wafer from the chucking unit of said first machining member; forming a predetermined gap between the chucking unit of said second machining member and said wafer; and cleaning the back surface of said semiconductor wafer by discharging a liquid from said chucking unit of said second machining member.

According to the above-described aspect of the present invention, the operation of cleaning the back surface of the semiconductor wafer using a liquid includes at least one of the first cleaning operation, which includes cleaning the back surface of the semiconductor wafer by discharging the liquid from the chucking unit of the first machining member, and the second cleaning operation, which includes cleaning the back surface of the semiconductor wafer by discharging the liquid from the chucking unit of the second machining member. Since the back surface of the semiconductor wafer is cleaned by discharging a fluid from the chucking unit in the present invention, immersing semiconductor wafers in a water bath like the conventional technology is not required. Therefore, a use of the manufacturing method according to the present invention dose not require to use a water bath, thereby preventing an increase of a dimension of the manufacturing apparatus. Further, since the liquid is discharged from the chucking unit to clean the back surface of the semiconductor wafer, and thus the cleaning operation is conducted under a condition, in which a semiconductor wafer is not held by a chucking unit, a slurry adherently remained on the back surface of the semiconductor wafer can be surely removed. In addition to above, liquid may be not discharged from the chucking unit of the second machining member until the cleaning operation is started, or alternatively, liquid may be continuously discharged from the pre-cleaning operation to the end of the cleaning operation, in order to prevent drying of the chucking unit of the second machining member.

According to the present invention, a method for manufacturing a semiconductor device a semiconductor wafer is provided, in which a removal of slurry that is adherently remained on the back surface of the semiconductor wafer can be ensured without a need for employing an increased dimension of apparatus.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
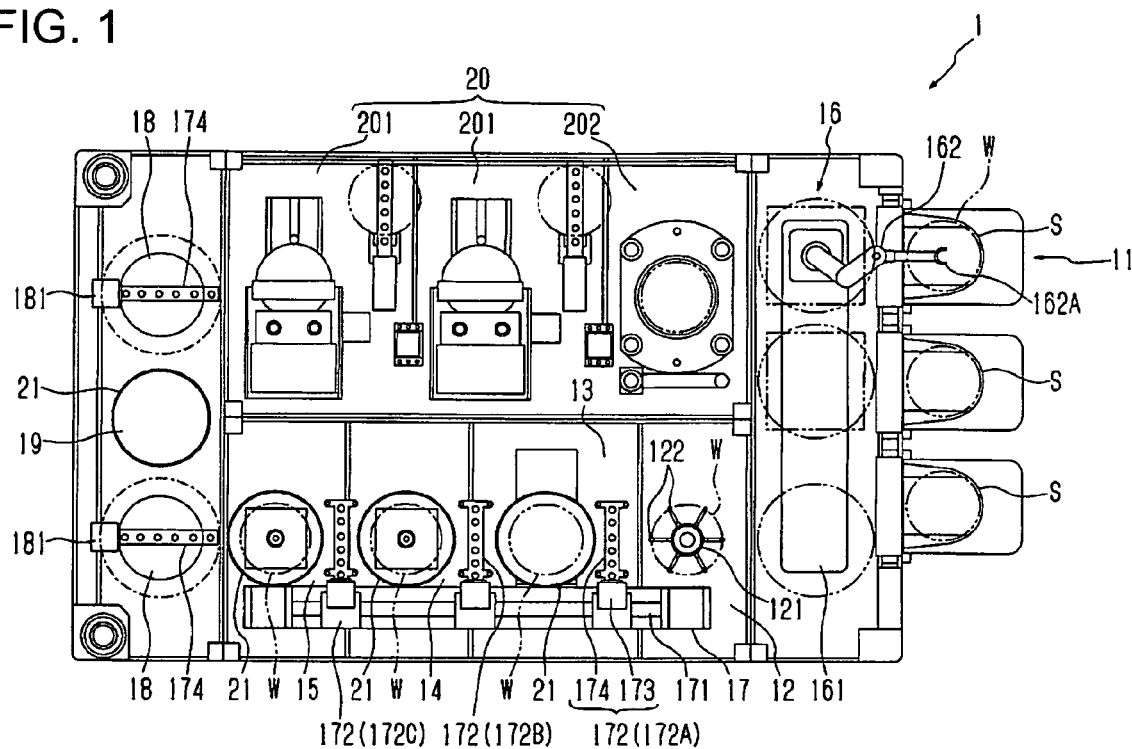
FIG. 1 is a plan view showing a polishing apparatus according to an embodiment of the present invention.

Embodiments of the present invention will be described as follows, in reference to drawings. A polishing apparatus 1 is shown in FIG. 1. The polishing apparatus 1 is apparatus dedicated for conducting a polishing process (machining process) for an edge portion of a semiconductor wafer W. Here, though it is not shown in the diagram, the semiconductor wafer W includes a substrate body such as a silicon (Si) substrate, a plurality of semiconductor layers insulating layers and interconnect layers, which are deposited on the surface of the substrate body. A plurality of semiconductor layers insulating layers and interconnect layers composes, for example, transistors. When a number of semiconductor layers, insulating layers, interconnect layers or the like are formed on the substrate body in such semiconductor wafer W, the semiconductor layers, the insulating layers and the interconnect layers are easily peeled off from an edge portion of the semiconductor wafer W. When the portion peeled off therefrom is adhered onto the surface of the semiconductor wafer W, device performances may be often reduced. Therefore, the semiconductor wafer W including the semiconductor layers, the insulating layers and the interconnect layers formed on the substrate body is bevel-polished, so that a peeling off of the semiconductor layer, the insulating layer and the interconnect layer from the edge portion of the semiconductor wafer W is prevented.

Such polishing apparatus 1 includes: a mounting unit 11, which is utilized for mounting a cassette thereon that stores the semiconductor wafers W; an aligning unit 12 for aligning a semiconductor wafer W; first to third polishing units (machining units) 13 to 15 for polished the semiconductor wafer W; a first transfer device 16 for transferring the semiconductor wafer W between the mounting unit 11 and the aligning unit 12; a second transfer device 17 for transferring the semiconductor wafer W between the first polishing unit 13 and the third polishing unit 15; a pair of reversing unit 18 for reversing the front surface and back surface of the semiconductor wafer W; a fourth polishing unit 19 disposed between the reversing units 18; and a post processing unit 20 for conduct a post processing after polishing.

Mounting unit 11 is the mount which disposes a plurality of cassette S in parallel that stores the semiconductor wafers W. The semiconductor wafers W stored in the cassette S is transferred to the aligning unit 12 by a first transfer device 16. Here, the first transfer device 16 includes a rail unit 161 that extends along a direction in parallel with a direction of arranging the cassettes S, and an arm 162 that is capable of moving on the rail unit 161. A chucking unit 162A, which is capable of being chucked to the back surface of the semiconductor wafer W, is provided to a head of the arm 162, and the semiconductor wafer W is transferred while the back surface of the semiconductor wafer W is chucked by the chucking unit 162A.

The aligning unit 12 is disposed to be opposite to the mounting unit 11 across the first transfer device 16 therebetween. The aligning unit 12 has a mount 121, and a plurality of aligning pins 122 protruding along a perpendicular direction to the plane of FIG. 1 are disposed in the periphery of the mount 121. An alignment of center of the semiconductor wafer W is performed by contacting the aligning pins 122 with an edge portion of the semiconductor wafer W.

Figure 2:
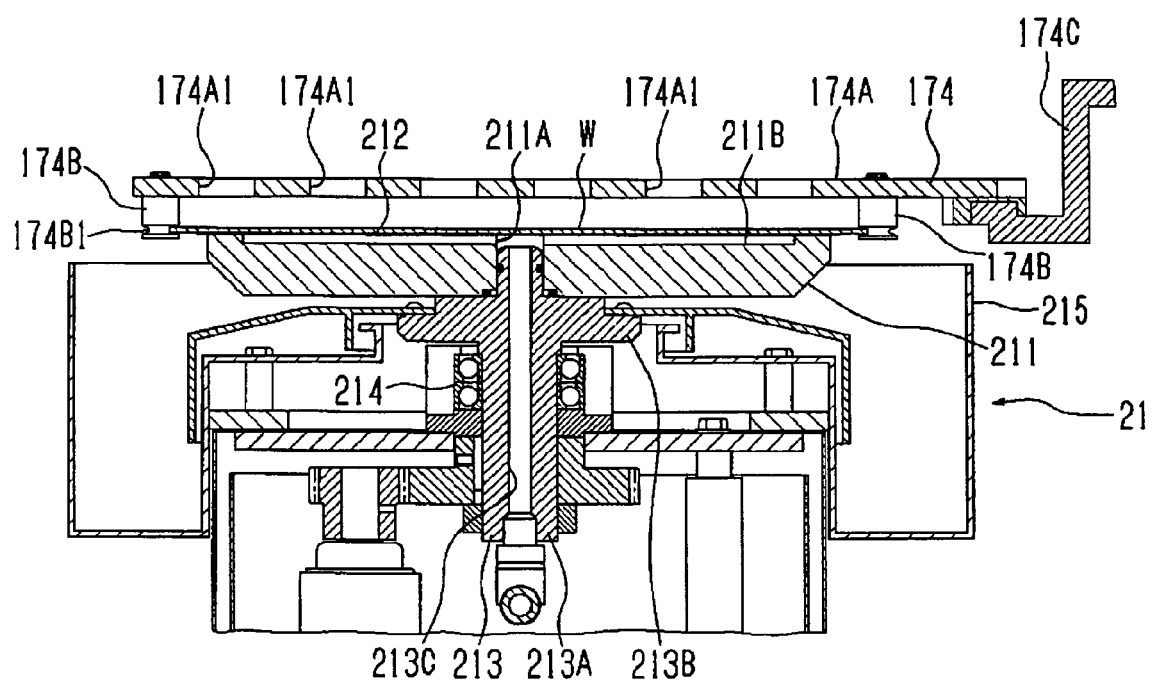
FIG. 2 is a cross-sectional view showing a chucking unit of the polishing apparatus.

A first polishing unit 13 is disposed to be adjacent the aligning unit 12. The first polishing unit 13 includes a chucking unit 21, which holds a semiconductor wafer W and is capable of chucking the back surface of the semiconductor wafer W, and a polishing unit body 22 (FIG. 8B) for polishing a notch WN created in the semiconductor wafer W. Here, the notch in the semiconductor wafer W is a V-shaped notch WN formed in the edge portion of the semiconductor wafer (see FIG. 8A). Such notch is created for the purpose of facilitating an alignment of the semiconductor wafer W. The chucking unit 21 includes, as shown in FIG. 2, a lower chuck 211 for holding a back surface of a semiconductor wafer W, a chucking pad 212, a rotating shaft 213, a bearing 214 and a case 215. The lower chuck 211 is formed to be disc-shaped, and has a through-hole 211A formed in a center thereof. A plurality of trenched portions 211B are formed so as to radially extend from the aforementioned through-hole 211A on the surface of the lower chuck 211, as showing FIG. 3. Such trenched portion 211B communicates with the through-hole 211A. Diameter of the through-hole 211A is, for example, 3 to 15 mm. Among these, it is preferable to be 6 to 10 mm.

Figure 3:
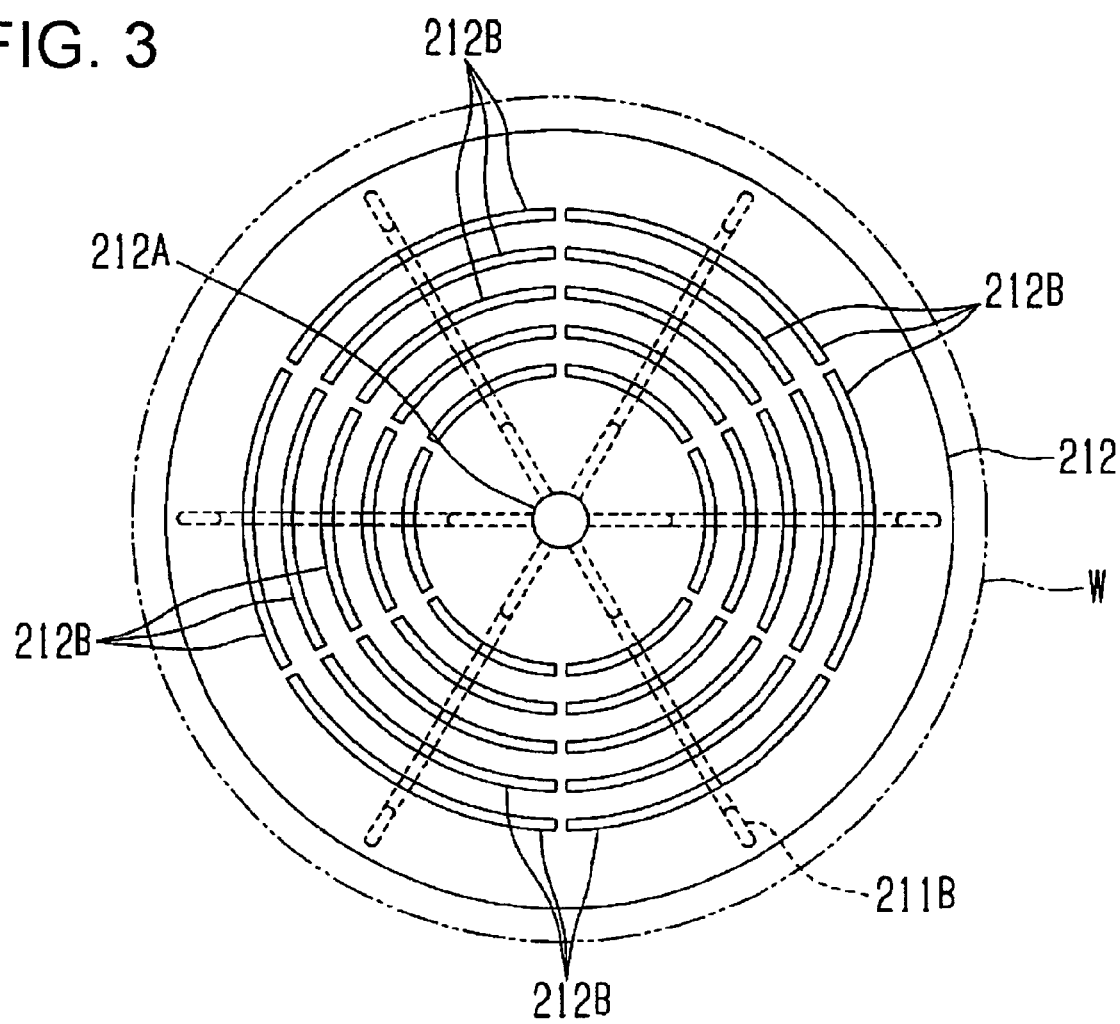
FIG. 3 is a plan view showing a chucking pad of the chucking unit.

A chucking pad 212 is installed on the surface of the lower chuck 211. As shown in FIG. 3, a through-hole 212A is formed in the center of the chucking pad 212. Further, a plurality of arc-shaped trenches 212B are formed on the surface of chucking pad 212, so as to surround such through-hole 212A. Diameter of the through-hole 212A is equivalent to diameter of the through-hole 211A of the lower chuck 211, and for example, 3 to 15 mm. Among these, it is preferable to be 6 to 10 mm.

The rotating shaft 213 includes a main shaft 213A inserted in the through-hole 211A of the lower chuck 211, and a flange portion 213B formed in the main shaft 213A and supports the back surface of the lower chuck 211. A tip portion of the main shaft 213A is inserted in the through-hole 211A of the lower chuck 211. Further, the main shaft 213A is provided with a through-hole 213C extending toward the longitudinal direction (axis direction) formed therein. The bottom end of the main shaft 213A, though it is not shown, is connected to a duct for introducing water to through-hole 213C and is also connected to a vacuum pump for drawing air from the through-hole 213C. By drawing air from the through-hole 213C with the vacuum pump, the back surface of the semiconductor wafer W is fixedly chucked to the chucking pad 212. Further, water is introduced into the through-hole 213C, so that water is discharged via the through-hole 213C, the through-hole 211A of the lower chuck 211 and the through-hole 212A of the chucking pad 212. In other words, water is discharged from substantially center position in the chucking surface of the semiconductor wafer W of the chucking unit 21. Further, the main shaft 213A is configured to be capable of being rotated around a rotating axis of the longitudinal direction of the main shaft 213A, and a ball bearing 214 is disposed as a shaft bearing between the rotating shift 213 and the member in a case 215 for storing the rotating shaft 213.

Figure 4A:
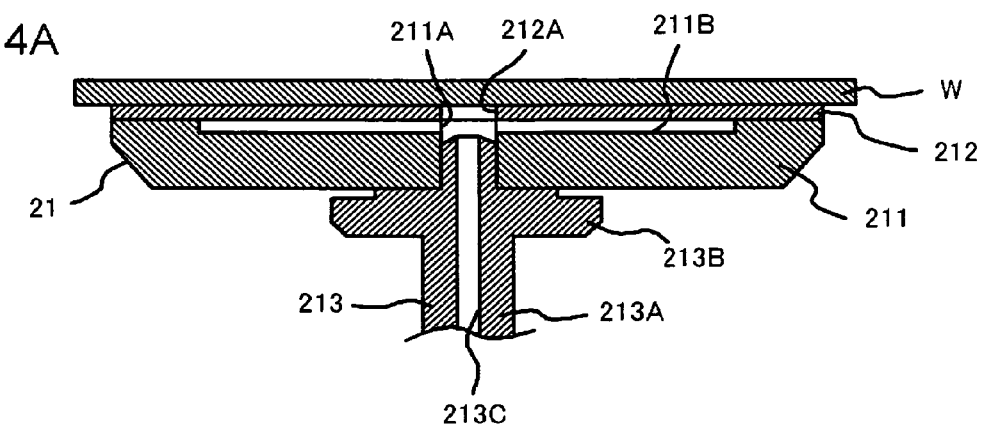
FIGS. 4A to 4C are schematic diagrams showing a process for manufacturing semiconductor wafer W, which employs a polishing apparatus.
Figure 4B:
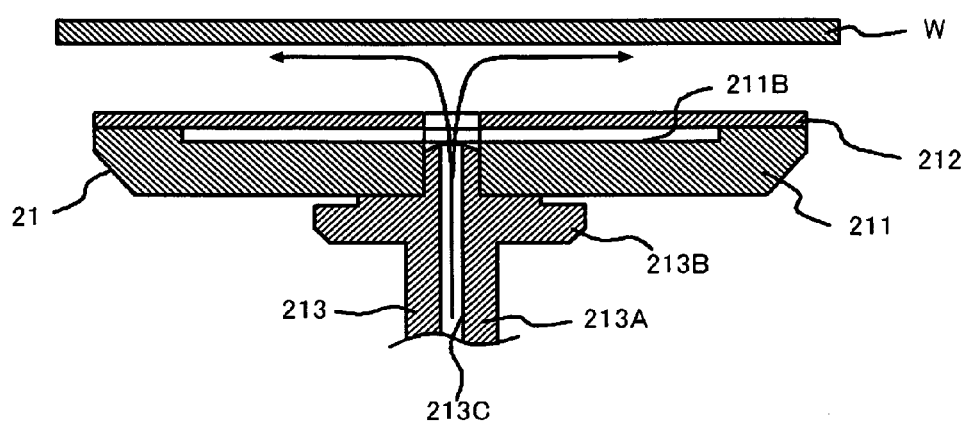
Figure 4C:
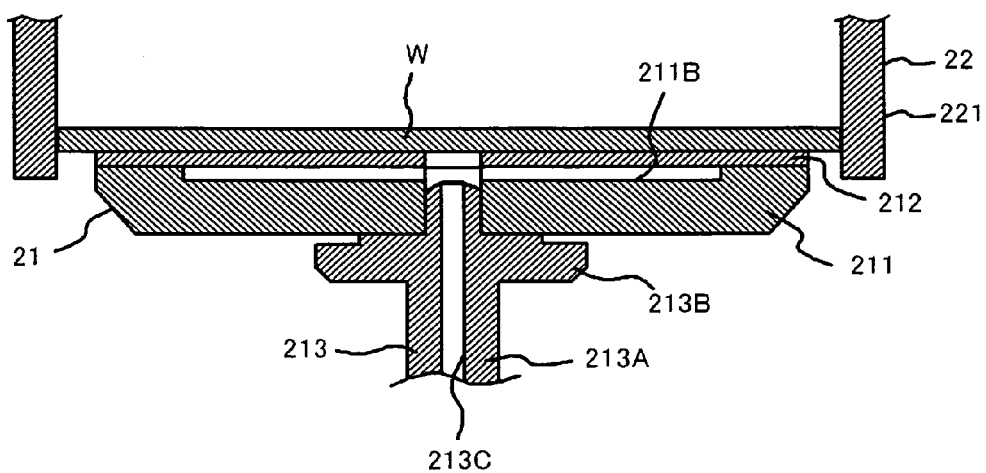

Now returning to FIG. 1, the second polishing unit 14 will be described. The second polishing unit 14 is disposed to be adjacent the first polishing unit 13, and serves for polishing the outer surface W1 of the semiconductor wafer W (see FIG. 6). The second polishing unit 14 includes a chucking unit 21 having a similar configuration as the first polishing unit 13 and a polishing unit body 22 for polishing the outer surface W1 of the semiconductor wafer W (see FIG. 4C). The polishing unit body 22 is disposed above the chucking unit 21, and is configured to be vertically movable. The polishing unit body 22 is, as shown in FIG. 4C, composed by sticking a polishing cloth (not shown) onto an inner side of a cylindrical member 221. When the outer surface W1 of the semiconductor wafer W is polished, the outer surface W1 of the semiconductor wafer W is forced to be in contact with the polishing cloth attached to the cylindrical member 221. Then, the chucking unit 21 is driven to rotate the semiconductor wafer W, and the cylindrical member 221 is driven to rotate itself in a reverse direction against a direction of rotation of the semiconductor wafer W.

Figure 5:
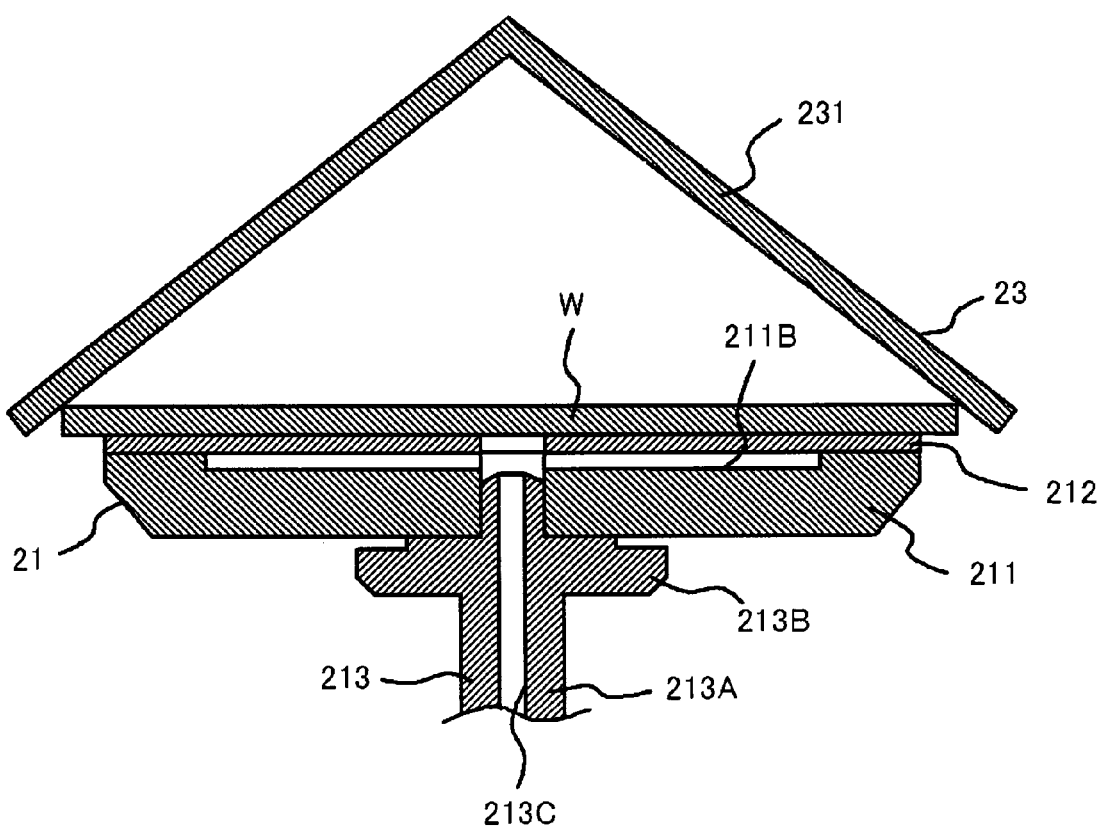
FIG. 5 is a schematic diagram showing a process for manufacturing semiconductor wafer W, which employs a polishing apparatus.

Third polishing unit 15 is disposed to be adjacent the second polishing unit 14. The third polishing unit 15 is employed for bevel polishing a corner of the surface of the edge portion of the semiconductor wafer W to form a beveled surface W2 shown in FIG. 6. The third polishing unit 15 includes a chucking unit 21 and a polishing unit body 23 for conducting a bevel polishing of the semiconductor wafer W (see FIG. 5). The polishing unit body 23 is disposed above the chucking unit 21, and is configured to be vertically movable. The polishing unit body 23 includes a bell-shaped member 231, as shown in FIG. 5, and is attached a polishing cloth (not shown) onto an inner side of the bell-shaped member 231. When the bevel polishing of the corner of the front surface of the edge portion of the semiconductor wafer W is conducted, the corner of the front surface of the edge portion of the semiconductor wafer W is forced to be in contact with the polishing cloth in the inner side of the bell-shaped member 231. Then, the chucking unit 21 is driven to rotate the semiconductor wafer W, and the bell-shaped member 231 is driven to rotate itself in a reverse direction against a direction of rotation of the semiconductor wafer W.

The second transfer device 17 is utilized to transfer the semiconductor wafer W among the first polishing unit 13, the second polishing unit 14 and the third polishing unit 15, as shown in FIG. 1. The second transfer device 17 includes a rail unit 171 that extends along a direction of arranging the polishing units 13 to 15, and a plurality of wafer retaining unit (retaining unit) 172 that is capable of sliding on the rail 171. Among a plurality of wafer retaining units 172, the first wafer retaining unit 172A is movable between the aligning unit 12 and the first polishing unit 13, and is capable of transferring the semiconductor wafer W from the aligning unit 12 to the first polishing unit 13. The second wafer retaining unit 172B is movable between the first polishing unit 13 and the second-polishing unit 14, and is capable of transferring the semiconductor wafer W from the first polishing unit 13 to the second polishing unit 14. The third wafer retaining unit 172C is movable between the second polishing unit 14 and the third polishing unit 15, and is capable of transferring the semiconductor wafer W from the second polishing unit 14 to the third polishing unit 15.

Such wafer retaining unit 172 includes a sliding unit 173 that is capable of sliding on the rail 171, and a retaining unit body 174, which is fixed to this sliding unit 173 and employed for retaining an edge portion of a semiconductor wafer W. The retaining unit body 174 includes, as shown in FIG. 2, an arm 174C extending from the sliding unit 173, an elongated frame 174A installed to a head of the arm 174C and a wafer edge-retaining unit 174B provided in both ends of the frame 174A and protruding downward. The arm 174C is, though it is not shown, vertically movable on the sliding unit 173. The frame 174A is flat-plate shaped, and is provided with a plurality of holes 174A1 formed therein. These holes 174A1 are arranged along the longitudinal direction of the frame 174A. The wafer edge retaining unit 174B is composed of a pair of substantially cylindrical protrusions that are downwardly protruded from both ends of the frame 174A, and the edge surfaces of these protrusions are provided the trenches 174B1 formed therein. By inserting the edge portion of the semiconductor wafer W into the trenches 174B1, the semiconductor wafer W is held by the retaining unit body 174.

The reversing unit 18 is disposed to be adjacent the third polishing unit 15, as shown in FIG. 1, and is capable of turn over the front and back of the semiconductor wafer W that is retained thereon. The reversing unit 18 includes a retaining unit body 174 and a driving unit 181 for driving to rotate the retaining unit body 174. The retaining unit body 174 is capable of being reversed around a rotating axis of the shaft of the frame 174A extending along the longitudinal direction thereof.

Figure 6:
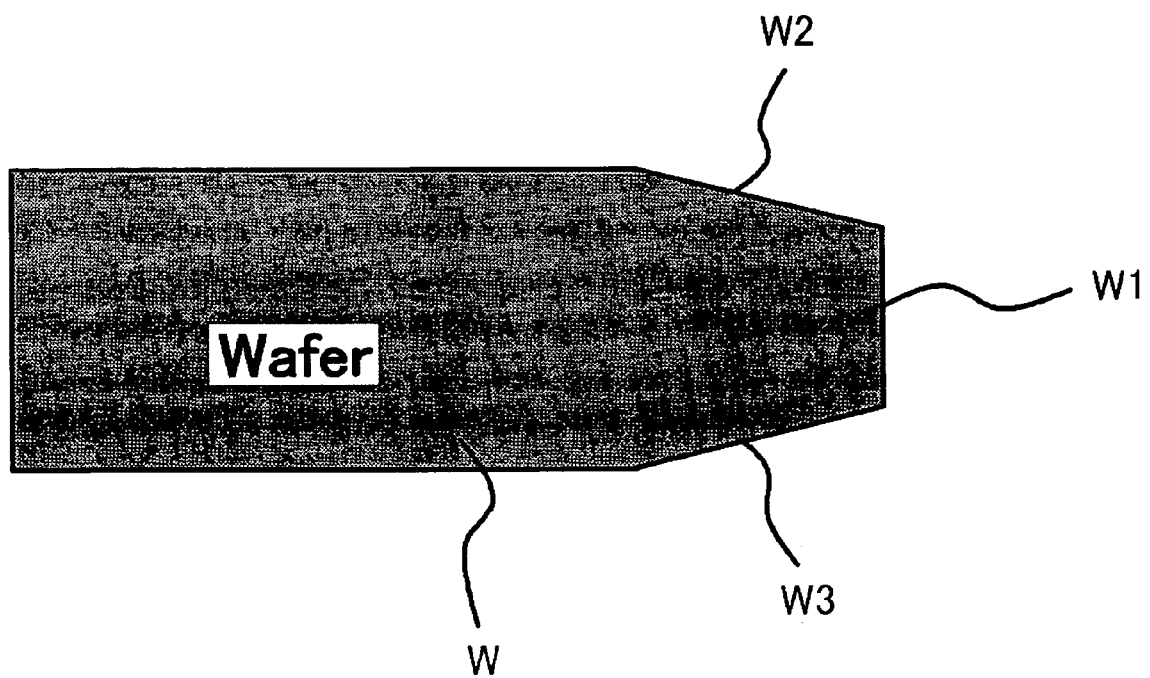
FIG. 6 shows an edge portion of a semiconductor wafer.

The fourth polishing unit 19 includes a chucking unit 21 having a similar configuration as the third polishing unit 15 and a polishing unit body (not shown) having a similar configuration as the third polishing unit 15. Such fourth polishing unit 19 is employed to conduct a bevel polishing of the corner of back surface of the wafer (beveled surface W3 of FIG. 6 is formed).

The post processing unit 20 includes two brush cleaning units 201 for cleaning with a roll brush and a spin cleaning unit 202 for conducting a spin cleaning. In each of the two brush cleaning units 201, a brush cleaning for the semiconductor wafer W is conducted while supplying thin aqua ammonia.

Next, a process for manufacturing the semiconductor wafer W employing such polishing apparatus 1 will be described. Following descriptions will be made in reference to FIG. 1, FIGS. 4A to 4C and FIG. 5. First of all, a semiconductor wafer W is unloaded from the cassette S by the first transfer device 16. In this case, the back surface of the semiconductor wafer W is chucked by the chucking unit 162A located in the head of the arm 162 of the first transfer device 16, and the semiconductor wafer W is held by the first transfer device 16. Next, the arm 162 of the first transfer device 16 moves on the rail 161, and transfers the semiconductor wafer W is to the aligning unit 12.

In the aligning unit 12, the semiconductor wafer W is disposed on the mount 121 and the wafer is centered on the mount by aligning pins 122. Thereafter, the wafer retaining unit 172 of the second transfer device 17 (i.e., first wafer retaining unit 172A) is drove to transfer the first wafer retaining unit 172A toward the side of the aligning unit 12, so that edge of the semiconductor wafer W is inserted into the trench 174B1 formed in the wafer edge retaining unit 174B of the first wafer retaining unit 172A. Having such procedure, the semiconductor wafer W is suitably held by the second transfer device 17.

Next, the arm 174C of the first wafer retaining unit 172A is driven to transfer the semiconductor wafer W to the above of the mount 121, and further, to transfer the first wafer retaining unit 172A on the rail 171 from the aligning unit 12 toward the first polishing unit 13. While the semiconductor wafer W is transferred toward the first polishing unit 13 from the aligning unit 12, water is sprayed toward the side of the front surface of the semiconductor wafer W from the upper side of the semiconductor wafer W. Such sprayed water moisturize the front surface of the semiconductor wafer W through the holes 174A1 in the frame 174A of the first wafer retaining unit 172A. In addition, while the semiconductor wafer W is transferred toward the first polishing unit 13 from the aligning unit 12, water is also sprayed toward the side of the back surface of the semiconductor wafer W from the lower side of the semiconductor wafer W. Such water moisturize the back surface of the semiconductor wafer W.

In addition to above, spraying of water to the semiconductor wafer W is not only conducted when the semiconductor wafer W is transferred from the aligning unit 12 toward the first polishing unit 13, but also conducted when the semiconductor wafer W is transferred: from the first polishing unit 13 to the second polishing unit 14; from the second polishing unit 14 to the third polishing unit 15; from the third polishing unit 15 to the reversing unit 18; from the reversing unit 18 to the fourth polishing unit 19; from the fourth polishing unit 19 to the reversing unit 18; and from the reversing unit 18 to the brush cleaning unit 201. However, the slurry adherently remained onto the back surface of the semiconductor wafer W is hardly removed by such spraying of water.

Figure 8A:
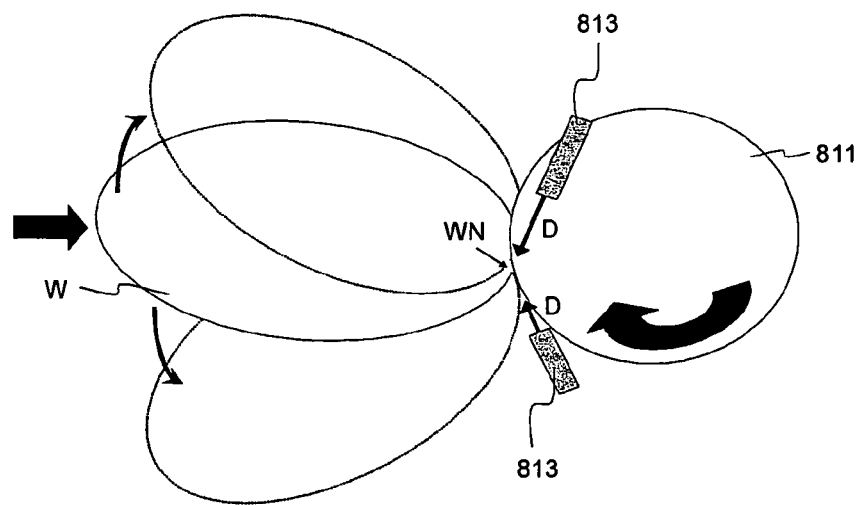
FIGS. 8A and 8B shows a process for polishing the notch in the semiconductor wafer.
Figure 8B:
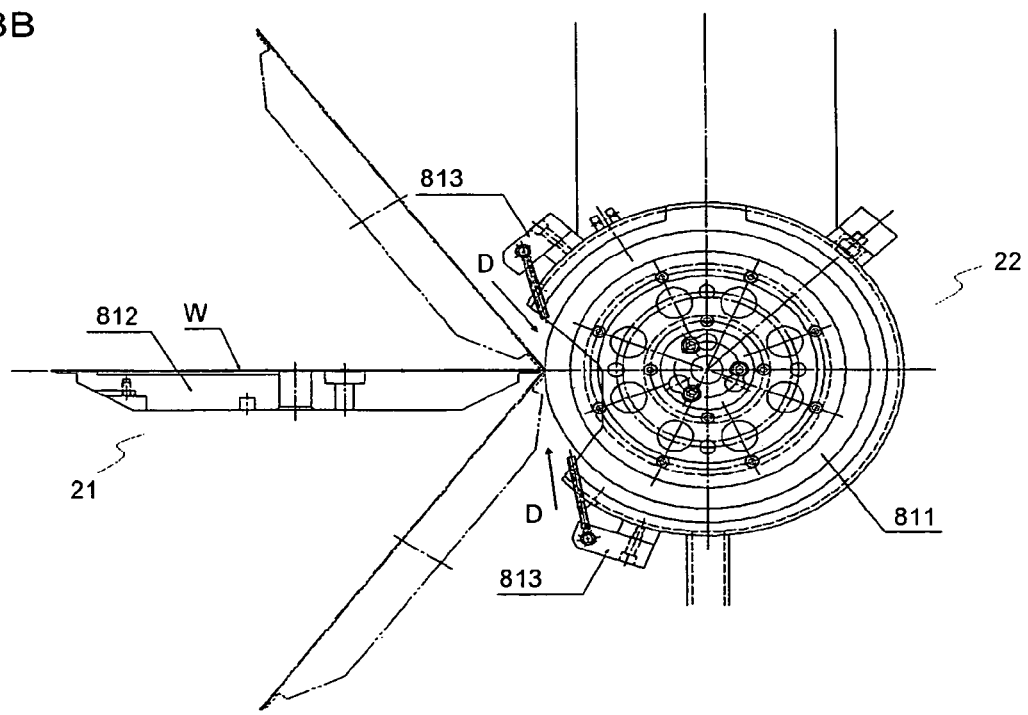

While the semiconductor wafer W is transferred from the aligning unit 12 toward the first polishing unit 13, water is discharged from the chucking unit 21 of the first polishing unit 13 toward the upward direction. Such discharging of water prevents drying of the chucking pad 212 of chucking unit 21. When the semiconductor wafer W is disposed above the chucking unit 21 of the first polishing unit 13, discharging of water from the chucking unit 21 is stopped. Thereafter, the arm 174C of the first wafer retaining unit 172A is driven to move downward, so that the semiconductor wafer W is mounted on the chucking unit 21. After the semiconductor wafer W is mounted on the chucking unit 21, holding the semiconductor wafer W by the first wafer retaining unit 172A is released, and then the first wafer retaining unit 172A is driven to move toward the side of the aligning unit 12. In the chucking unit 21, air is drawn from the through-holes 213C of the main shaft 213A, so that the back surface of the semiconductor wafer W is chucked to the chucking unit 21 (see FIG. 4A). Then, the polishing unit body (FIGS. 8A and 8B) of the first polishing unit 13 is employed to polish the notch in the semiconductor wafer W (machining operation). The process for polishing the notch in the semiconductor wafer W will be described in detail in reference to FIG. 8A and FIG. 8B. FIG. 8A and FIG. 8B shows an example for polishing a notch in a semiconductor wafer. FIG. 8A is a schematic diagram, useful in describing a process for polishing a notch. FIG. 8B is a plan view, useful in describing a supply of slurry in the process for polishing the notch. The polishing unit body 22 comprises a polishing drum 811. Besides, the chucking unit 21 comprises a chucking stage 812. A semiconductor wafer W is disposed on the chucking stage 812, and is chucked thereon so as to be fixed thereto. A notch portion WN of a wafer W is forced against the rotating polishing drum 811, and the wafer W is inclined up and down, and then, the notch WN of the semiconductor wafer is polished while supplying a slurry from a supply nozzle 813 toward a direction indicated by a passage D.

Next, the chucking of the semiconductor wafer W onto the chucking unit 21 is released, the wafer retaining unit 172 (second wafer retaining unit 172B in this case) of the second transfer device 17 slides toward the side of the first polishing unit 13, and the semiconductor wafer W is held by the second wafer retaining unit 172B.

The arm 174 C of second wafer retaining unit 172B is driven to transfer the semiconductor wafer W to the above of the chucking unit 21 of the first polishing unit 13, and further, to transfer the second wafer retaining unit 172B from the first polishing unit 13 toward the second polishing unit 14. In this case, water is discharged from the chucking unit 21 of the second polishing unit 14 toward the upward direction. More specifically, water is discharged via the through-holes 213C of the main shaft 213A of chucking unit 21, the through-holes 211A of the lower chuck 211 and the through-holes 212A of the chucking pad 212. Water discharged from the chucking unit 21 prevents drying of the chucking pad 212 of chucking unit 21. Further, while the second wafer retaining unit 172B is moved on rail 171 from the first polishing unit 13 toward the second polishing unit 14, the chucking unit 21 of the second polishing unit 14 is driven to rotate itself.

The semiconductor wafer W is disposed above the chucking unit 21 of such second polishing unit 14. Once the semiconductor wafer W is disposed above the chucking unit 21 of the second polishing unit 14, rotation of the chucking unit 21 of the second polishing unit 14 is stopped. Next, the arm 174C of the second wafer retaining unit 172B is driven to bring the semiconductor wafer W closer to the chucking unit 21. Here, the semiconductor wafer W is disposed with a predetermined spacing from the chucking unit 21. Then water is discharged from the chucking unit 21 toward the substantial center of the back surface of the semiconductor wafer W. Discharged water flows along the back surface of the semiconductor wafer W from the substantial center of the back surface of the semiconductor wafer W toward the edge thereof, so that the back surface of the semiconductor wafer W is cleaned (see FIG. 4B, cleaning operation). Having such procedure, the semiconductor wafer W is cleaned while the edge portion of the semiconductor wafer W is retained by the second wafer retaining unit 172B, thereby to remove polishing scum, slurry adherently remained on the back surface of the semiconductor wafer W.

Here, it is preferable that a distance between the back surface of the semiconductor wafer W and the chucking unit 21 that discharges water is within a range of from 0.5 mm to 5 mm and a pressure of water discharged from the chucking unit 21 is within a range of from 0.05 MPa to 0.5 MPa. Among the pressures, a pressure within a range of from 0.1 MPa to 0.2 MPa is more preferable. Further, it is preferable that water discharged from the chucking unit 21 is ultra-pure water. Alternatively, water discharged from the chucking unit 21 may be water treated by adding ultrasonic wave. In addition to above, in the present embodiment, water is continuously discharged from the chucking unit 21 of the second polishing unit 14, during the transfer of the semiconductor wafer W from the first polishing unit 13 toward the second polishing unit 14 and during the cleaning of the back surface of the semiconductor wafer W. Here, a pressure of water discharged from the chucking unit 21 of the second polishing unit 14 during the transfer of the semiconductor wafer W from the first polishing unit 13 toward the second polishing unit 14 may be different from a pressure of water discharged from the chucking unit 21 of the second polishing unit 14 during the cleaning of the back surface of the semiconductor wafer W, or both water pressures may be identical. For example, after the semiconductor wafer W is disposed with a predetermined spacing from the chucking unit 21 of the second polishing unit 14, a pressure of water from the chucking unit 21 may be adjusted to be within a range of from 0.05 MPa to 0.5 MPa to clean the back surface of the semiconductor wafer W.

Figure 9:
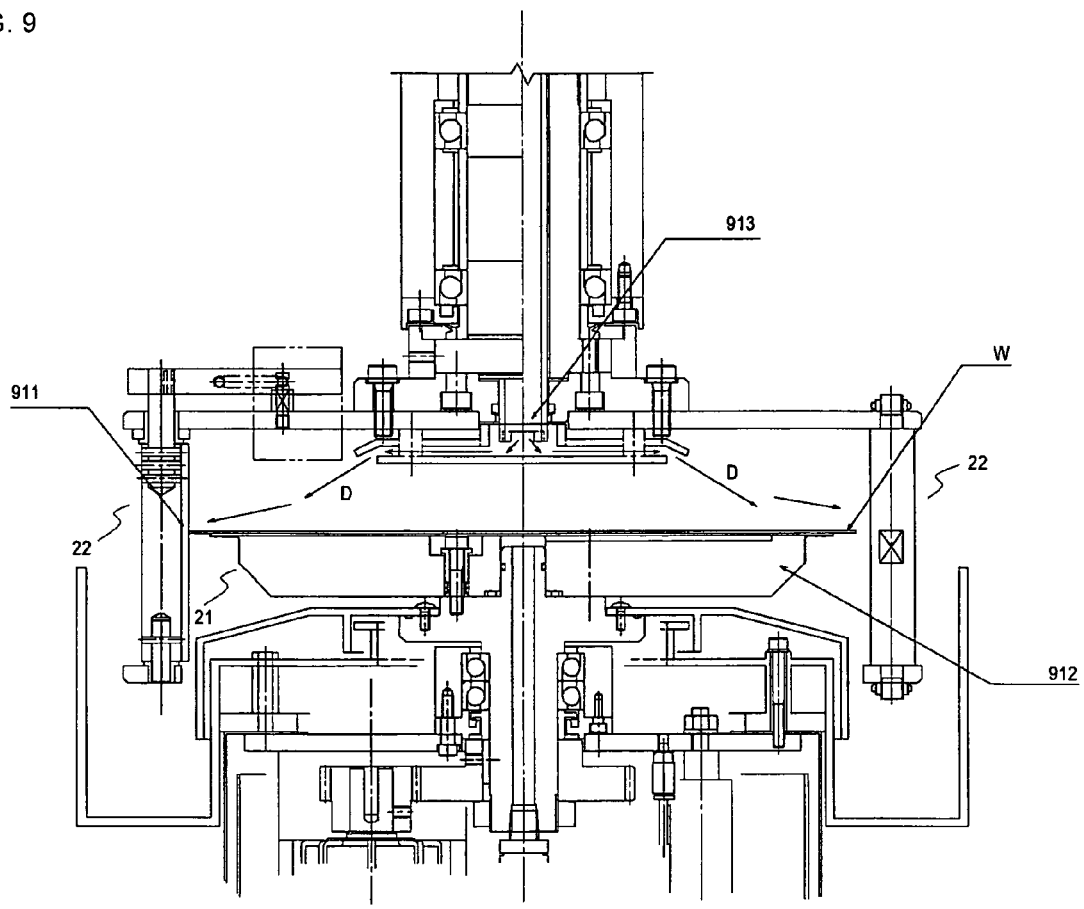
FIG. 9 shows a process for polishing an edge portion of the semiconductor wafer.

When the cleaning of the back surface of semiconductor wafer W is completed, a discharge of water from the chucking unit 21 is stopped. The arm 174C of the second wafer retaining unit 172B is driven to move downward, such that the semiconductor wafer W is mounted on the chucking unit 21. After the semiconductor wafer W is mounted on the chucking unit 21, holding the semiconductor wafer W by the second wafer retaining unit 172B is released, and then the second wafer retaining unit 172B is driven to move toward the side of the first polishing unit 13. Air is drawn from the through-holes 213C of the main shaft 213A of the chucking unit 21, so that the semiconductor wafer W is fixedly chucked to the chucking unit 21. Thereafter, the polishing unit body 22 located above the chucking unit 21 is lifted down, so that the edge surface of the semiconductor wafer W is in contact with the polishing cloth. Then the chucking unit 21 is driven to rotate itself so that the semiconductor wafer W is rotated, and the polishing unit body 22 is driven to rotate itself in a reverse direction against the direction of rotation of the semiconductor wafer W, thereby polishing the edge surface (outer surface W1) of the semiconductor wafer W (see FIG. 4C, machining operation). The polishing of the edge portion of the semiconductor wafer W will be described in detail as follows, in reference to FIG. 9. FIG. 9 shows an example for polishing an edge portion W1 of the semiconductor wafer W. The polishing unit body 22 includes a polishing pad 911. Besides, the chucking unit 21 includes a chucking stage 912. The semiconductor wafer W, which has been cleaned in the second polishing unit 14, is chucked so as to be fixed onto the chucking stage 912, and then, the semiconductor wafer W is rotated while supplying a slurry from a supply nozzle 913 toward a direction indicated by a passage D to polish the circumference portion W1 of the semiconductor wafer.

Next, the chucking of the semiconductor wafer W onto the chucking unit 21 of the second polishing unit 14 is released, the wafer retaining unit 172 (third wafer retaining unit 172C in this case) of the second transfer device 17 slides toward the side of the second polishing unit 14, and the semiconductor wafer W is held by the third wafer retaining unit 172C. Then, the semiconductor wafer W is transferred to the third polishing unit 15 from the second polishing unit 14. In this case, water is discharged toward the upward direction from the chucking unit 21 of the third polishing unit 15. Further, while the wafer retaining unit 172 is moved from the second polishing unit 14 toward the third polishing unit 15, the chucking unit 21 of the third polishing unit 15 is driven to rotate itself. By the third wafer retaining unit 172C, the semiconductor wafer W is disposed above the chucking unit 21 of the third polishing unit 15. Once the semiconductor wafer W is disposed above the chucking unit 21 of the third polishing unit 15, rotation of the chucking unit 21 is stopped. Then, the semiconductor wafer W is brought to be closer to the chucking unit 21 of the third polishing unit 15. The semiconductor wafer W is disposed above the chucking unit 21 of the third polishing unit 15 with a predetermined spacing from the chucking unit 21 of the third polishing unit 15. Then, similarly as in the cleaning operation described above, the back surface of the semiconductor wafer W is cleaned (cleaning operation).

Figure 10:
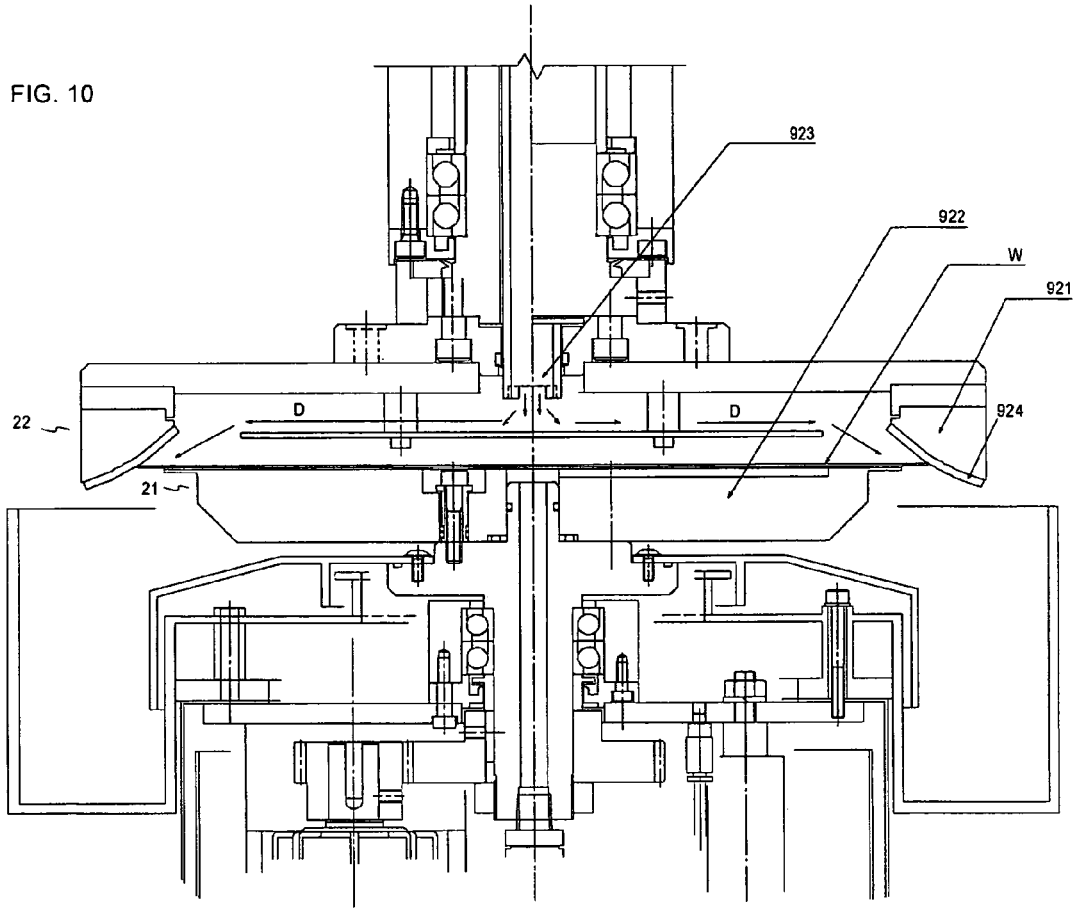
FIG. 10 shows a process for polishing of beveled surface of the semiconductor wafer.

When the cleaning of the back surface of semiconductor wafer W is completed, a discharge of water from the chucking unit 21 is stopped. The arm 174C is drove to move downward, such that the semiconductor wafer W is mounted on the chucking unit 21. After the semiconductor wafer W is mounted on the chucking unit 21, holding the semiconductor wafer W by the third wafer retaining unit 172C is released, and then the third wafer retaining unit 172C is driven to move toward the side of the second polishing unit 14. Air is drawn from the through-holes 213C of the main shaft 213A of the chucking unit 21 of the third wafer retaining unit 172C, so that the semiconductor wafer W is chucked so as to be fixed to the chucking unit 21. Thereafter, a bell-shaped member 231 of the polishing unit body 23 located above the chucking unit 21 is lifted down, so that the edge surface of the semiconductor wafer W is in contact with the polishing cloth. Then the chucking unit 21 is driven to rotate itself so that the semiconductor wafer W is rotated, and the bell-shaped member 231 is driven to rotate itself in a reverse direction against the direction of rotation of the semiconductor wafer W, thereby conducting a beveling polishing (polishing of beveled surface W2) of the semiconductor wafer W (see FIG. 5, machining operation). The beveling polishing of the semiconductor wafer W will be described in detail as follows, in reference to FIG. 10. FIG. 10 shows an example for a beveling polishing of the semiconductor wafer W. The polishing unit body 22 includes a polishing drum 921. The chucking unit 21 includes a chucking stage 922. The semiconductor wafer W, which has been cleaned in the second polishing unit 14, is fixedly chucked onto the chucking stage 922, and then, the semiconductor wafer W is rotated while supplying a slurry from a supply nozzle 923 toward a direction indicated by a passage D to polish the beveled surface W2 of the semiconductor wafer W with a polishing pad 924.

Next, the semiconductor wafer W disposed on the chucking unit 21 of the third polishing unit 15 is transferred to one of the reversing units 18 by the transfer device that is not shown. In one of the reversing units 18, the semiconductor wafer W is retained while the back surface of the semiconductor wafer W is turned toward downside. Thereafter, the front surface and the back surface of the semiconductor wafer W is reversed, so that the back surface of the semiconductor wafer W be turned up. Then, the semiconductor wafer W is held on the chucking unit 21 of the fourth polishing unit 19, and is polished. In this case, the surface of semiconductor wafer W is chucked to the chucking unit 21. Further, in this case, a cleaning operation for the semiconductor wafer W by discharging water from the chucking unit 21 is not conducted. Once the polishing is completed, the front surface and the back surface of the semiconductor wafer W is reversed again, while the semiconductor wafer W is held on the other reversing unit 18. This causes the back surface of semiconductor wafer W is turned down.

Thereafter, the semiconductor wafer W is transferred to the brush cleaning unit 201 by a transfer device that is not shown. A brush cleaning operation for the semiconductor wafer W is conducted with respective brush cleaning units 201, and then, the wafer is transferred to the spin cleaning unit 202. A spin cleaning of semiconductor wafer W is carried out, and eventually the polishing of the edge portion of the semiconductor wafer W (bevel polishing) is completed.

Advantageous effects obtainable by employing the configuration of the present embodiment will be described as follows. Since the back surface of the semiconductor wafer W is cleaned by discharging water from the chucking unit 21, an immersion of the semiconductor wafer W in water bath is not required, unlike the conventional technology. Therefore, a use of the process for manufacturing the semiconductor wafer W of the present embodiment can avoid a need for employing a water bath, thereby preventing an increase of a dimension of the manufacturing apparatus. Further, since the back surface of the semiconductor wafer W is cleaned by discharging water from the chucking unit 21, and thus a cleaning operation under the condition of chucking the semiconductor wafer W to the chucking unit 21 is not conducted in the present embodiment, a removal of slurry that is adherently remained on the back surface of the semiconductor wafer W can be ensured. Since the polishing process can be conducted while chucking the wafer so as to be fixed to the chucking unit 21 after slurry adherently remained onto the back surface of the semiconductor wafer W is removed, this can prevent the slurry from being firmly stuck on the back surface of the semiconductor wafer W.

When the semiconductor wafer is a substrate having no semiconductor layer, insulating layer, or interconnect layer formed on the surface thereof, slurry firmly stuck on the back surface of the semiconductor wafer can be removed by a cleaning with higher concentration of alkali solution. However, when the semiconductor wafer W having the semiconductor layer, the insulating layer and the interconnect layer formed on the surface thereof is employed like the present embodiment; it is very difficult to conduct a cleaning with higher concentration of alkali solution. Therefore, it is considerably useful to conduct a processing of the semiconductor wafer W in the procedure, in which the back surface of the semiconductor wafer W is cleaned by discharging water from the chucking unit 21 to remove the slurry that is adherently remained on the back surface of the semiconductor wafer W, and then the polishing process is conducted while chucking the wafer so as to be fixed to the chucking unit 21, like the present embodiment.

Further, since the cleaning of the back surface of the semiconductor wafer W is conducted immediately before the back surface of the semiconductor wafer W is chucked to the chucking unit 21 in the present embodiment, the chucking of the dried back surface of the semiconductor wafer W to the chucking unit 21 can be prevented.

Further, since the hydraulic pressure of water discharged from the chucking unit 21 is selected to be within a range of from 0.05 MPa to 0.5 MPa and the distance between the back surface of the semiconductor wafer W and the chucking unit 21 that discharges water is selected to be within a range of from 0.5 mm to 5 mm, a removal of slurry that is adherently remained on the back surface of the semiconductor wafer W can be ensured. Here, a hydraulic pressure of lower than 0.05 MPa or a spacing between the back surface of the semiconductor wafer W and the chucking unit 21 that discharges water of larger than 5 mm would cause a difficulty in conducting sufficient cleaning of the back surface of the semiconductor wafer W. Further, a water pressure of higher than 0.5 MPa or a distance between the back surface of the semiconductor wafer W and the chucking unit 21 that discharges water of smaller than 0.5 mm would cause a difficulty in flowing water along the back surface of the semiconductor wafer W.

Further, the chucking unit 21 is driven to rotate itself before the back surface of the semiconductor wafer W is cleaned by discharging water from the chucking unit 21 in the present embodiment. Having such procedure, the slurry that is adherently remained on the back surface of the semiconductor wafer W can be removed, thereby preventing the slurry from entering a gap between the chucking unit 21 and the back surface of the semiconductor wafer W.

Further, in the present embodiment, water is discharged from the chucking unit 21 toward the substantial center of the back surface of the semiconductor wafer W, and water flows from the substantial center of the back surface of the semiconductor wafer W toward an edge portion thereof, such that the slurry or the like adherently remained onto the back surface of the semiconductor wafer W can be efficiently eliminated toward the edge of the semiconductor wafer W.

It can be understood that the present invention is not limited to the above-described embodiments, and various modifications and variations of the present invention are within a scope of the invention as long as these modifications can provide the object of the present invention. For example, on cleaning the back surface of the semiconductor wafer W, the rotation of the chucking unit 21 stops in the above-described embodiment during the back surface cleaning of the semiconductor wafer W by discharging water from the chucking unit 21. However, the cleaning procedure is not limited thereto, and for example, the chucking unit 21 can be rotated during the back surface cleaning of the semiconductor wafer by discharging water from the chucking unit 21. This provides further ensured removal of the slurry adherently remained on the back surface of the semiconductor wafer W.

Further, while the chucking unit 21 of the first polishing unit 13 is not driven to rotate itself before the semiconductor wafer W is chucked to the chucking unit 21 of the first polishing unit 13 in the above-described embodiment, the chucking unit 21 of the first polishing unit 13 can be driven to rotate itself before the semiconductor wafer W is chucked to the chucking unit 21 of the first polishing unit 13. For example, while the semiconductor wafer W is transferred from the aligning unit 12 toward the first polishing unit 13 (i.e., before the semiconductor wafer W is disposed above the chucking unit 21 of the first polishing unit 13), the chucking unit 21 of the first polishing unit 13 can be driven to rotate itself to remove the slurry adherently remained on the chucking unit 21 of the first polishing unit 13.

Further, in the above-described embodiment, when water is discharged from the chucking unit 21 for cleaning the back surface of the semiconductor wafer W, available liquid to be discharged is not limited to water. Available liquid may be, for example, a diluted solution of basic or acidic solution, which is unreactive with the slurry, or an active water by electrolysis or addition of ozone. Further, though the semiconductor wafer W is disposed above the chucking unit 21 of the second polishing unit 14 after conducting the polishing process in the first polishing unit 13, and the back surface of the semiconductor wafer W is cleaned by discharging water from the chucking unit 21 of the second polishing unit 14 in the above-described embodiment, the procedure according to the present invention is not limited thereto. For example, the semiconductor wafer W can be disposed above the chucking unit 21 of the first polishing unit 13 after conducting the polishing process in the first polishing unit 13, and a predetermined gap may be formed between the chucking unit 21 of the first polishing unit 13 and the semiconductor wafer W, and then, the back surface of the semiconductor wafer W may be cleaned by discharging water from the chucking unit 21 of the first polishing unit 13. Both of the cleaning operation utilizing the chucking unit 21 of the first polishing unit 13 and the cleaning operation utilizing the chucking unit 21 of the second polishing unit 14 may be conducted. Similarly, after conducting the polishing process in the second polishing unit 14, a predetermined gap may be formed between the chucking unit 21 of the second polishing unit 14 and the semiconductor wafer W, and then, the back surface of the semiconductor wafer W may be cleaned by discharging water from the chucking unit 21 of the second polishing unit 14.

Though the semiconductor wafer W of the above-described embodiment includes a substrate body and a semiconductor layer or the like formed on the surface of the substrate body, the available semiconductor wafer is not limited thereto, and the semiconductor wafer may be composed of only the substrate body without a semiconductor layer or the like. Further, while the edge portion of the semiconductor wafer is polished in the above-described embodiment, the polishing procedure is not limited thereto, and, or example, the semiconductor wafer may be polished via a chemical mechanical polishing (CMP) process. It may be assumed that a CMP apparatus includes, for example, a first polishing unit and a second polishing unit. The first polishing unit includes a polishing unit body for polishing a surface of a semiconductor wafer (disc-shaped polishing surface plate having a polishing pad stuck on the surface thereof), and a chucking unit for chucking on a back surface of the semiconductor wafer. The second polishing unit includes a polishing surface plate having a stuck polishing pad of different roughness from the roughness of the polishing pad of the first polishing unit (polishing unit body), and a chucking unit for chucking and holding on a back surface of the semiconductor wafer. While a back surface of a semiconductor wafer is chucked to a chucking unit of the first polishing unit of the CMP apparatus, the semiconductor wafer held by the chucking unit is brought to be closer to the polishing surface plate from upward of the polishing surface plate of the first polishing unit, and then, the surface of the semiconductor wafer is polished (first machining operation). Next, the semiconductor wafer is removed from the polishing surface plate of the first polishing unit, and the semiconductor wafer is dechucked from the chucking unit of the first polishing unit, and further, the edge portion of the semiconductor wafer is retained by a transfer device. Thereafter, the semiconductor wafer is transferred to the location below the chucking unit of the second polishing unit, and water is discharged from the chucking unit of the second polishing unit toward the back surface of the semiconductor wafer (cleaning operation). Then, the back surface of the semiconductor wafer is chucked to the chucking unit of the second polishing unit, and a second polishing is conducted (second machining operation).

Further, though the edge portion of the semiconductor wafer is polished in the above-described embodiment, a surface grinding of the semiconductor wafer, for example, may be conducted.

An example of the present invention will be described.

EXAMPLE

Figure 7:
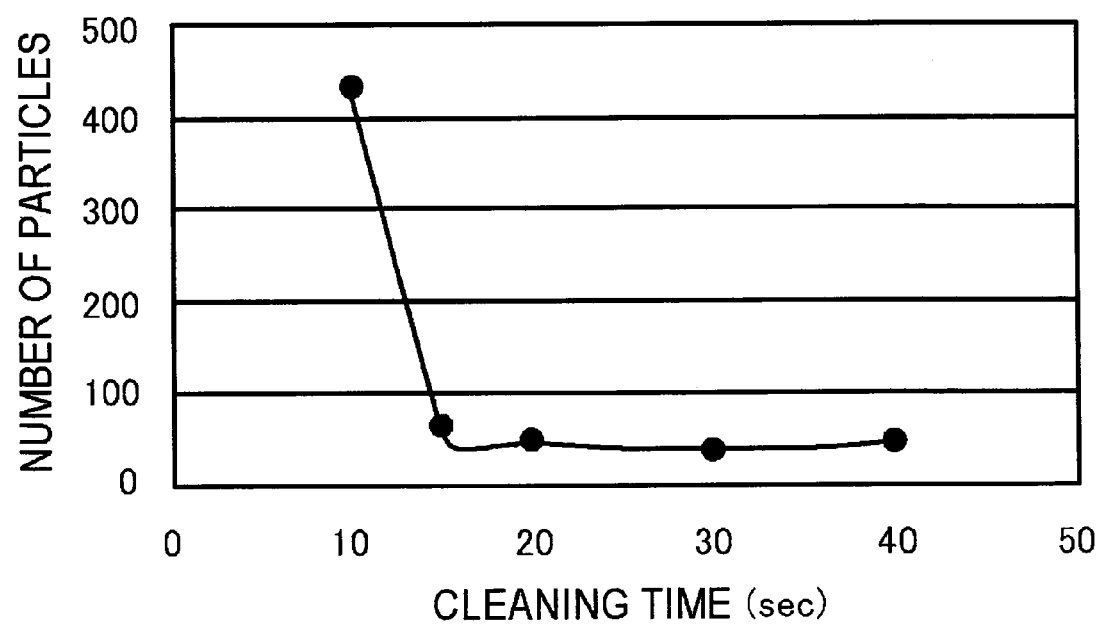
FIG. 7 is a graph, showing results of examples.

A beveled polishing of a semiconductor wafer was conducted by a similar process as employed in the above-described embodiment. However, before cleaning a back surface of the semiconductor wafer, a chucking unit was not rotated. Further, in the cleaning operation, a distance between the chucking unit and the back surface of the semiconductor wafer was 2 mm, and a flow rate of water discharging from the chucking unit was 3 litter/min. (i.e., water pressure of 0.1 MPa). Results are shown in FIG. 7. No mark of the chucking pad was observed in the back surface of the semiconductor wafer, and number of particles having diameter equal to or larger than 0.18 µm was less than 500 counts/wafer. Further, in this example, number of particles remained on the back surface of the semiconductor wafer did not increase, even if number of process cycles for the semiconductor wafers increased.

COMPARATIVE EXAMPLE

A cleaning operation for cleaning the back surface of the semiconductor wafer was not conducted. Other conditions were similar to that employed in the above-described Example. A mark of the chucking pad was observed in the back surface of the semiconductor wafer that had been bevel-polished, and number of particles having diameter equal to or larger than 0.18 µm was more than 4000 counts/wafer. Further, in this comparative example, the number of particles on a wafer having diameter equal to or larger than 0.18 µm increased by increasing the process number using the same polishing unit.

It is apparent that the present invention is not limited to the above embodiment, and may be modified and changed without departing from the scope and spirit of the invention.

What is claimed is:

1. A method for manufacturing a semiconductor device or a semiconductor wafer, comprising:
   machining a semiconductor wafer while a back surface of said semiconductor wafer is chucked to a chucking unit of a first machining member;
   dechucking said semiconductor wafer from said chucking unit of said first machining member;
   cleaning the back surface of said semiconductor wafer with a liquid; and
   polishing said semiconductor wafer while chucking a back surface of said semiconductor wafer to a chucking unit of a second machining member,
   wherein said cleaning the back surface of said semiconductor wafer includes at least one of a first cleaning operation and a second cleaning operation,
   wherein said first cleaning operation includes:
   dechucking said semiconductor wafer from the chucking unit of said first machining member;
   forming a predetermined gap between the chucking unit of said first machining member and said semiconductor wafer; and
   cleaning the back surface of said semiconductor wafer by discharging a liquid from said chucking unit of said first machining member; and
   wherein said second cleaning operation includes:
   dechucking said semiconductor wafer from the chucking unit of said first machining member;
   forming a predetermined gap between the chucking unit of said second machining member and said semiconductor wafer; and
   cleaning the back surface of said semiconductor wafer by discharging a liquid from said chucking unit of said second machining member.

2. the method for manufacturing the semiconductor device or the semiconductor wafer according to claim 1, wherein, in said cleaning the back surface of said semiconductor wafer, a water pressure of the liquid discharged from said chucking unit is within a range of from 0.05 MPa to 0.5 MPa, and a distance between the back surface of said semiconductor wafer and said chucking unit that discharges the fluid is within a range of from 0.5 mm to 5 mm.

3. The method for manufacturing the semiconductor device or the semiconductor wafer according to claim 1, wherein, in said cleaning the back surface of said semiconductor wafer, the fluid is discharged from said chucking unit toward a substantially central position in the back surface of said semiconductor wafer, and the fluid flows from substantially central position in the back surface of said semiconductor wafer toward an edge portion thereof.

4. The method for manufacturing the semiconductor device or the semiconductor wafer according to claim 1, wherein, in said cleaning the back surface of said semiconductor wafer, an edge portion of said semiconductor wafer is held with a retaining unit of a transfer device.

5. The method for manufacturing the semiconductor device or the semiconductor wafer according to claim 1, wherein said cleaning the back surface of said semiconductor wafer includes:

dechucking said semiconductor wafer from the chucking unit of said first machining member;

forming a gap between the chucking unit of said second machining member and said semiconductor wafer; and cleaning the back surface of said semiconductor wafer by discharging the liquid from said chucking unit of said second machining member.

6. The method for manufacturing the semiconductor device or the semiconductor wafer according to claim 5, wherein, before said forming the gap between the chucking unit of said second machining member and said semiconductor wafer, the chucking unit of said second machining member is drove rotation.

7. The method for manufacturing the semiconductor device or the semiconductor wafer according to claim 1, wherein said machining the semiconductor wafer and polishing said semiconductor wafer include: polishing the edge portion of said semiconductor wafer.

8. The method for manufacturing the semiconductor device or the semiconductor wafer according to claim 7, wherein said semiconductor wafer includes: at least one selected from the group consisting of a semiconductor layer, an insulating layer and an interconnect layer, which is located on a substrate.

* * * * *